April 4, 1961 R. L. WATTERS 2,978,576

RADIO-FREQUENY AMPLIFIER AND CONVERTER CIRCUITS

Filed March 1, 1960

Inventor:
Robert L. Watters,
by
His Attorney.

United States Patent Office 2,978,576

Patented Apr. 4, 1961

2,978,576

RADIO-FREQUENCY AMPLIFIER AND CONVERTER CIRCUITS

Robert L. Watters, Schenectady, N.Y., assignor to General Electric Company, a corporation of New York Filed Mar. 1, 1960, Ser. No. 12,056

8 Claims. (Cl. 250—20)

This invention relates to improvements in radio-frequency amplifier and converter circuits and particularly to such circuits employing semiconductor devices and capable of performing radio-frequency amplifying and converting functions simultaneously.

The semiconductor devices used in the practice of this invention are narrow junction degenerate semiconductor diodes or so-called "tunnel diodes." Such diodes are semiconductor devices including a single P–N junction and exhibiting a region of negative resistance in the low forward voltage range of their current-voltage characteristics.

Devices of this type are fabricated so as to provide regions of P and N-type conductivity having a very narrow junction therebetween, both of the regions being "degenerate." The use of the term "degenerate" refers to a body or region of semiconductive material which, if N-type, contains a sufficient concentration of excess donor impurity to raise the "Fermi-level" thereof to a value of energy higher than the minimum energy of the conduction band on the energy band diagram of the semiconductive material. In a P-type semiconductive body or region, degeneracy means that a sufficient concentration of excess acceptor impurity is present therein to depress the "Fermi-level" to an energy lower than the maximum energy of the valence band on the energy band diagram for the semiconductive material. The "Fermi-level" in such an energy band diagram is the energy level at which the probability of there being an electron present is equal to one half.

The forward voltage range of the current-voltage characteristic at which the negative resistance region appears varies, depending upon the semiconductive material from which the device is fabricated. For example, the range of the negative resistance region is from about 0.04 to 0.3 volt for germanium; about 0.08 to 0.4 volt for silicon and about 0.03 to 0.3 volt for gallium antimonide. It is a device such as described above which is referred to herein as a narrow junction degenerate semiconductor device.

For further details concerning the narrow junction degenerate semiconductor device utilized in the practice of this invention, reference may be had to the copending application of Jerome J. Tiemann, Serial No. 858,995, filed December 11, 1959, which is assigned to the assignee of the present invention and incorporated herein by reference.

This invention is an improvement over the invention in the co-pending application of Jerome J. Tiemann, Serial No. 861,884, filed December 24, 1959, and assigned to the assignee of the present invention, which invention was made by said Jerome J. Tiemann prior to my invention. I, therefore, do not herein claim anything shown or described in the said Tiemann application, which is to regarded as prior art with respect to the present application.

The radio-frequency amplifier and converter of the Tiemann application, Serial No. 861,884, comprises a narrow junction degenerate semiconductor diode and a frequency responsive network in circuit therewith. The frequency responsive network includes a first and second resonant circuit branch. Signal power impressed on the first resonant circuit branch is regeneratively amplified by the narrow junction diode and mixed with the oscillations at the predetermined frequency to produce an output at an intermediate frequency which depends upon the amplitude of the signal.

While the converter circuit of the aforementioned Tiemann application is of great utility and permits the attainment of multiple functions utilizing a minimum of circuit components, for broad-band operation, lack of signal interference from very strong signals and greater flexibility in use, it is desirable that further development of semiconductor oscillator and converter circuits be made.

It is a primary object of this invention, therefore, to provide an improved broad band radio-frequency amplifier and converter which is free of undesirable signal interference.

It is another object of this invention to provide a circuit which simultaneously provides radio-frequency amplifying and converting of a plurality of input signals employing a single narrow junction degenerate semiconductor diode as the only active element therein.

It is another object of this invention to provide a radio-frequency amplifier and converter which is more flexible in selection of components or adjustments than prior art circuits.

It is still another object of this invention to provide a radio-frequency amplifier and converter which has improved selectivity and minimum image response characteristics.

Briefly stated, in accordance with one aspect of the present invention, an improved radio-frequency amplifier and converter comprises a narrow junction degenerate semiconductor diode, biased in its negative resistance region, in circuit with a frequency responsive network. The frequency responsive network includes at least three resonant circuit branches. One branch has an impedance at its resonant frequency which exceeds the highest impedance of either of the other branches such that local oscillations are produced only at the resonant frequency thereof. At least one of the other branches is resonant to the frequency of an input signal and the other of the circuit branches is resonant to an intermediate frequency which may be either the sum or difference of the input and local oscillator frequencies. Appropriate selection of resonant circuit branches provides a circuit which simultaneously performs a plurality of radio-frequency amplifying and converting functions employing a single narrow junction degenerate semiconductor diode as the only active element.

The novel features which I believe to be characteristic of my invention are set forth with particularity in the appended claims. My invention itself, however, together with further objects and advantages thereof will best be understood by reference to the following description, taken in conjunction with the accompanying drawing, in which:

Figure 1:
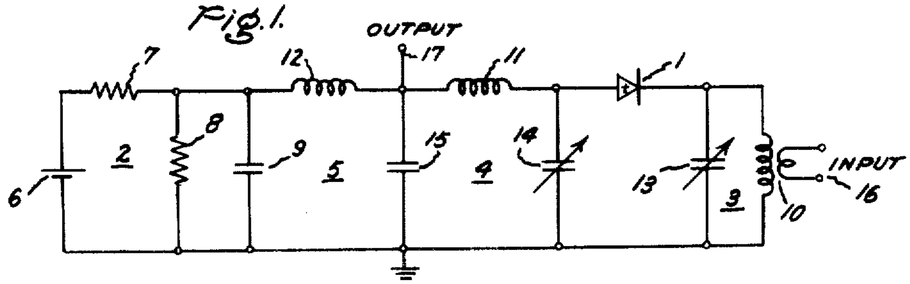
Fig. 1 is a schematic circuit diagram of one embodiment of this invention.

The radio-frequency amplifier and converter of Fig. 1 utilizes the negative resistance and non-linear characteristics of narrow junction degenerate semiconductor diode 1 to provide, simultaneously, oscillations at the local oscillator frequency, amplification at a signal frequency, mixing of the local oscillator and signal frequencies to provide a desired intermediate frequency and amplification at the intermediate frequency.

In Fig. 1 a radio-frequency amplifier and converter comprises a narrow junction degenerate semiconductor diode 1 in circuit with a bias voltage source, generally designated at 2, and a frequency responsive network having three resonant circuit branches, generally designated 3, 4 and 5.

Figure 2:
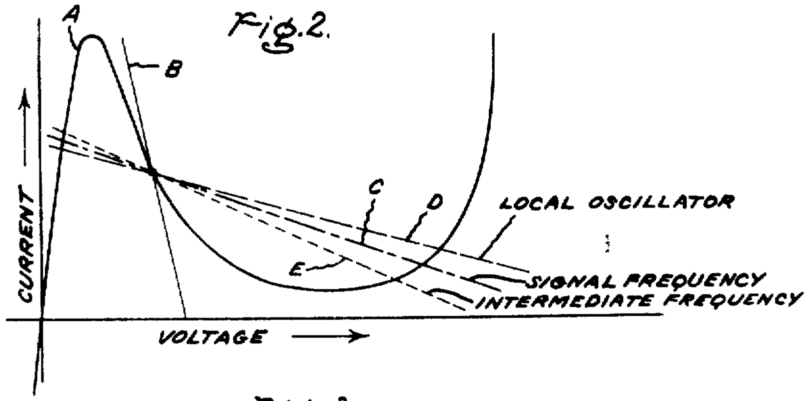
Fig. 2 is a curve illustrating a typical current-voltage characteristic of a narrow junction degenerate semiconductor diode suitable for use in the practice of this invention.

Bias means 2 supplies diode 1 with a low forward voltage such that the average operating point thereof is in the negative resistance region of its current-voltage characteristic. This is assured by selection of a bias voltage supply source and resistance such that a direct current load line is established which intersects the diode current-voltage characteristic only in the negative resistance region. A typical current-voltage characteristic A with an appropriate direct current load line B is shown in Fig. 2. Establishment of such a load line requires the direct current shunt resistance across diode 1 to be made less than the absolute value of teh diode negative resistance.

The "absolute" value of negative resistance used herein refers to the slope of the negative resistance region of the current-voltage characteristic and, therefore, has a value depending upon the particular narrow junction diode used.

Bias means 2 includes voltage supply source 6 and series-parallel resistances 7 and 8. Capacitance 9, shunting resistance 8, is a by-pass for alternating current. It is readily apparent, however, that the above described bias requirements may be fulfilled in various other arrangements if desired, provided that the direct current load line is established as outlined above.

The frequency responsive network includes at least three resonant circuit branches. Each branch includes inductance and capacitance and is in series circuit with diode 1 and bias means 2. This assures a current path from voltage supply source 6 to diode 1 to provide the appropriate bias. For example, bias current flows from one side of voltage source 6 through inductances 10, 11 and 12, associated with resonant circuit branches 3, 4 and 5 respectively, diode 1 and resistance 7 to the other side of the voltage source. In operation, however, one side of each of the capacitances 13, 14 and 15 is at a common potential and this is shown schematically in Fig. 1. Additional resonant circuit branches may be similarly connected in series with diode 1 as desired.

A first or input resonant circuit branch 3 is resonant to a selected signal frequency and includes inductance 10 and capacitance 13. A second resonant circuit branch 4 includes inductance 11 and capacitance 14 and is resonant to a predetermined frequency referred to hereinafter as the local oscillator frequency. A third or output circuit branch 5 includes inductance 12 and capacitance 15 and is resonant to an intermediate frequency. "Intermediate frequency" is used herein in its conventional sense in relation to frequency conversion and modulation and, therefore, is related to the local oscillator and signal frequency since it may be either the sum or difference thereof. Input means 16 are provided for impressing signal power on the resonant circuit branch 3. This may be, for example, a simple antenna or other coupling means. Means are provided for taking an output at the intermediate frequency such as at circuit branch 5 through terminal 17.

While the circuit of Fig. 1 shows a frequency responsive network employing only three resonant circuit branches, additional branches may be provided in a similar arrangement to produce additional functions. For example, a plurality of input signals may be simultaneously amplified and converted by the addition of a resonant branch tuned to the additional signal frequency. If the frequency is such that, when mixed with the local oscillator frequency, an intermediate frequency is produced corresponding to the resonant frequency of circuit branch 5, an output may again be obtained at terminal 17. If the intermediate frequency produced is different, however, the addition of another circuit branch tuned to that intermediate frequency provides for an output to be taken therefrom at that frequency. Since the input signal is impressed on a separate resonant circuit branch tuned to its frequency, greater selectively is possible and there is no undesirable image response. The input signal is not required to have a frequency near that of the local oscillator and hence a wide range of intermediate frequencies is easily obtained. In addition, since each circuit branch functions separately, a plurality of input signals may be simultaneously amplified and converted with a voltage gain produced at both the input and the output frequencies.

Figure 3:
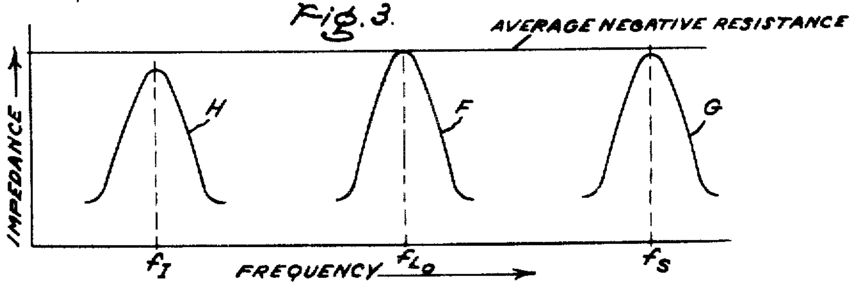
Fig. 3 shows curves illustrating the impedance of the three resonant circuit branches of the circuit of Fig. 1 with respect to frequency, and, Figs. 4, 5, 6, and 7 are equivalent circuit diagrams for the circuit of Fig. 1 at different frequency conditions respectively.

The operation of the radio-frequency amplifier and converter of Fig. 1 may best be described with reference to Figs. 2 and 3. Fig. 2 shows a typical current-voltage characteristic, A, of a degenerate semiconductor diode device suitable for use in the practice of this invention. Operating load lines C, D and E represent the highest impedance of each of the resonant circuit branches 3, 4 and 5 respectively. Fig. 3 shows the relationship between impedance and frequency for a specific arrangement in which all the circuit branches are parallel resonant and the signal frequency is higher than the local oscillator frequency by an amount equal to the intermediate frequency. In Fig. 3, the letters $f_S$, $f_{Lo}$ and $f_I$ indicate the signal, local oscillator and intermediate frequencies respectively. This invention, however, is not restricted to such an arrangement, which is given by way of example only. For example, one or more of the resonant circuit branches may be series resonant if desired and the signal frequency may be either above or below the frequency of the local oscillator.

In operation the following functions are provided simultaneously:

(1) Amplification at a selected signal frequency or frequencies.

(2) Oscillation at a selected local oscillator frequency.

(3) Mixing of the local oscillator and signal frequencies to provide one or more intermediate frequencies.

(4) Amplification at the intermediate frequencies obtained.

These functions are provided by the circuit arrangement of Fig. 1 by connecting diode 1 in circuit with a frequency responsive network having at least three resonant circuit branches 3, 4 and 5 in series therewith. Diode 1, when provided with a bias voltage from bias source 2 such that an average direct current operating point is established in the negative resistance region, produces oscillations at a frequency at which the impedance connected across it exceeds the absolute value of its negative resistance and is at the same time the highest value of impedance presented to it. To satisfy these requirements, therefore, resonant circuit branch 4 is selected to present the highest impedance across diode 1 at its resonant frequency. Thus, although circuit branch 4 is in series circuit with diode 1 at direct current (zero cycles) it is effectively in parallel therewith at its resonant frequency. In like manner circuit branches 3 and 5 are effectively in parallel with diode 1 at their selected frequencies.

Because of the nature of the diode negative resistance oscillations build up until the time average negative resistance of the diode just equals the positive resistance of circuit branch 4. This average negative resistance, therefore, is parallel to the load line D established by the impedance of circuit branch 4. Thus, there is a negative resistance always present in the circuit which may be utilized with the other circuit branches to perform the desired functions.

Although the highest impedance of the other circuit branches may also exceed the absolute value of the negative resistance of the diode, no oscillations are produced due to them for at least two reasons. First, the diode will oscillate only at the frequency at which it views the highest impedance and second the highest impedance of the other branches are adjusted to be less than the average negative resistance.

This is shown specifically in Fig. 3 where the resonant impedance of circuit branch 4 shown by curve F just equals the average negative resistance of the diode and the highest impedance of the other circuit branches 3 and 5, as shown by curves G and H respectively. Oscillations, therefore, are produced at the resonant frequency of circuit branch 4 only. Thus, even though diode 1 is producing oscillations at the local oscillator frequency the other circuit branches are, at the same time, effectively in circuit with this average negative resistance. This average negative resistance is usually greater than the absolute value which was referred to hereinbefore as being determined by the slope of the negative resistance region.

Figure 4:
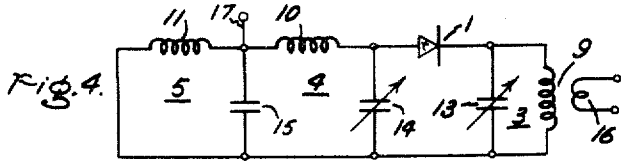

For simplicity of description, assume initially that the circuit of Fig. 1 is viewed with respect to each of the operating frequencies separately. For example, for all alternating current conditions except zero cycles (direct current) the circuit may be simplified to that shown at Fig. 4 since for these conditions by-pass capacitance 12 may be considered effectively a short circuit.

Figure 5:
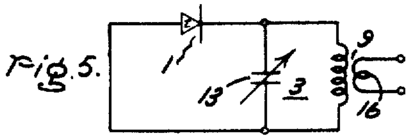

At the signal frequency circuit branch 3 has a high impedance while branches 4 and 5 may be considered as effectively removed from consideration since the impedance of circuit branch 4 at this frequency is very small and capacitance 15 serves as a by-pass. For example, since the resonance curves are relatively narrow as shown in Fig. 3, at frequencies different than the resonant frequency the impedance falls sharply. At frequencies greatly different from the resonant frequency the reactance due to the capacitance associated with the particular circuit branch is so small as to be effectively a short circuit. For the signal frequency, therefore, the equivalent circuit may be shown as that of Fig. 5.

Figure 6:
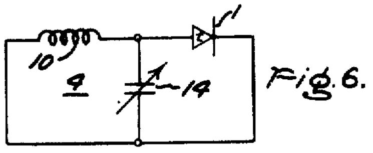
Figure 7:
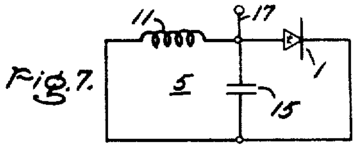

At the local oscillator frequency a similar situation obtains. Circuit branch 3 has an impedance at this frequency which is very low while circuit branch 5 having a resonant frequency which is different from the local oscillator frequency by a greater amount than that of circuit branch 3 is effectively a short circuit. Fig. 6, therefore, represents the equivalent circuit at the local oscillator frequency. Likewise Fig. 7 represents the equivalent circuit at the intermediate frequency.

Since the impedances of circuit branches 3 and 5, are less than the average negative resistance of diode 1 as shown in Fig. 3, no oscillations are produced at the frequencies corresponding to these impedance values but, due to the presence of the average negative resistance, there is an amplification of the input and output signals at their respective frequencies. The frequency conversion is accomplished by combining the signal and local oscillator voltages in a non-linear device. This non-linear device is again the narrow junction degenerate semiconductor diode. The non-linearity of the narrow junction diode used in this invention, however, is much greater than that of crystal or diode mixers so that the resulting mixing is better and more efficient than that obtained with such prior art devices.

Fig. 3 shows the highest impedance of circuit branch 3 as slightly greater than the highest impedance of circuit branch 5 so that the voltage gain at the signal frequency is greater than the voltage gain at the intermediate frequency. By suitable selection of the impedance values for circuit branches 3 and 5, however, the gain at the signal frequency may be made equal to, greater or less than the gain at the intermediate frequency when the impedances of circuit branch 3 is made equal to, greater or less than the impedance of circuit branch 5 respectively.

It can be seen, therefore, that the circuit branches function in dual roles having one function at one frequency and a different function at another frequency. For example, at the signal frequency circuit branch 4 is sufficiently "off resonance" that its impedance is relatively small. At the same time, since the resonant frequency of circuit branch 5 is different from the signal frequency by a greater amount than is circuit branch 4, capacitance 15 functions effectively as a by-pass for this signal. In like manner, at the intermediate frequency, circuit branch 4 is again sufficiently "off resonance" that the impedance is very small and capacitance 13 of circuit branch 3 functions as a by-pass at this frequency. In this way, although a plurality of circuit branches are included in a single frequency responsive network in series circuit with diode 1, each is effectively separate from the other and performs its individual function in combination with the diode. The above analysis serves to illustrate, in addition, that the invention need not be limited to only three resonant circuit branches since, by utilizing the same arrangement described above for the radio-frequency amplifier and converter having three resonant circuit branches, any further number of resonant circuit branches may be employed to provide the desired additional functions.

One circuit constructed in accord with the present invention provided for tuning circuit branches 3 and 5 over an input signal band of 88–108 mc. and provide an output at a constant intermediate frequency of 10 megacycles.

For example, the local oscillator frequency was made to track the signal frequency such that a 10 megacycle output was obtained over the entire input frequency band. Such a circuit utilized the following circuit parameters, which are given by way of example only:

| | |
|---|---|
| Voltage supply source 6 | 1.5 volts. |
| Resistance 7 | 5000 ohms variable. |
| Resistance 8 | 150 ohms. |
| Capacitance 9 | 1200 micromicrofarads. |
| Capacitance 15 | 250 micromicrofarads. |
| Capacitances 13 and 4 | 25 to 35 micromicrofarads maximum. |
| Inductance 10 | .075 to .1 microhenry. |
| Inductance 11 | .075 to .1 microhenry |
| Inductance 12 | 1 to 1.7 microhenrys. |

This circuit, when supplied with an alternating current signal of 88–108 megacycles applied at input 16, produced an output of 10 mc. at output terminal 17 with an overall conversion voltage gain of 1000 corresponding to a gain of 60 db and was stable.

The circuit was adjusted to provide this high voltage gain primarily for purposes of specifically showing the extremely stable properties of the circuit arrangement of the present invention.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent of the United States is:

1. A radio-frequency amplifier and converter comprising: a narrow junction degenerate semiconductor diode exhibiting a negative resistance region at the low forward voltage range of its current-voltage characteristic; bias means in circuit with said diode establishing a direct current load line which intersects said characteristic only in said negatve resistance region; and a frequency responsive network in circuit with said diode, said network including a local oscillator resonant circuit branch, at least one inetrmediate frequency resonant circuit branch and at least one input resonant circuit branch, the parallel resonant impedance of said local oscillator circuit branch exceeding the highest impedance of either of the other circuit branches producing oscillations only at the parallel resonant frequency of said local oscillator circuit branch and amplification at each of the other frequencies.

2. A circuit comprising: a narrow junction degenerate semiconductor diode exhibiting a negative resistance region at the low forward voltage range of its current voltage characteristic; bias means in circuit with said diode establishing a direct current load line which intersects said characterstic only in said negative resistance region; and an input resonant circuit branch, an output resonant circuit branch and a local oscillator resonant circuit branch in series with said diode, said input branch resonant to a selected signal frequency, said output branch resonant to a predetermined intermediate frequency and said local oscillator circuit branch resonant to a frequency such that oscillations thereat mixed with the signal frequency produce the predetermined intermediate frequency.

3. A radio-frequency amplifier and converter comprising: a narrow junction degenerate semiconductor diode exhibiting a negative resistance region in the low forward voltage range of its current-voltage characteristic; bias means in circuit with said diode establishing a direct current load line therefor which intersects said characteristic only in said negative resistance region; and a frequency responsive network in circuit with said diode and including an input resonant circuit branch resonant to a selected signal frequency, an output resonant circuit brach resonant to a selected intermediate frequency and a local oscillator circuit branch resonant to a frequency such that when mixed with said signal frequency the selected intermediate frequency is produced.

4. A radio-frequency amplifier and converter comprising: a narrow junction degenerate semiconductor diode; a frequency responsive network in circuit with said diode, said network including at least one input circuit branch, at least one output circuit branch and a local oscillator circuit branch, each of said branches having its highest impedance at a different frequency, the highest impedance of each of the branches being less than the highest impedance of said local oscillator branch such that oscillations are produced only at the frequency corresponding to the highest impedance of said local oscillator circuit branch; and bias means in circuit with said diode establishing a direct current load line which intersects the diode current-voltage characteristic only in the negative resistance region.

5. A radio-frequency amplifier and converter comprising: a narrow junction degenerate semiconductor diode exhibiting a negative resistance region in the low forward voltage range of its current-voltage characteristic; bias means in circuit with said diode establishing a direct-current load line which intersects said characteristic only in said negative resistance region; and a frequency responsive network in circuit with said diode and including an input resonant circuit branch, an output resonant circuit branch and a local oscillator resonant circuit branch, the impedances of said branches being so selected that the highest impedance of said local oscillator circuit branch exceeds the highest impedance of either of the other two circuit branches.

6. A radio-frequency amplifier and converter comprising: a narrow junction degenerate semiconductor diode exhibiting a region of negative resistance at the low forward voltage range of its current-voltage characteristic; bias means in circuit with said diode establishing a direct current load line which intersects said characteristic only in the region of negative resistance; and a frequency responsive network in circuit with said diode including a local oscillator circuit branch having a parallel resonant impedance higher than the highest impedance of said network and equal to the average negative resistance of said diode, a plurality of input circuit branches resonant to selected signal frequencies and a plurality of output circuit branches resonant to intermediate frequencies of said signal and local oscillator frequencies.

7. A radio-frequency amplifier and converter comprising: a narrow junction degenerate semiconductor diode exhibiting a negative resistance region at the low forward voltage range of its current-voltage characteristic; bias means in circuit with said diode establishing a direct current load line which intersects said characteristic only in said negative resistance region; a frequency responsive network in circuit with said diode, said network including a parallel resonant local oscillator circuit branch, at least one parallel resonant circuit branch resonant to a selected signal frequency and at least one parallel resonant circuit branch resonant to an intermediate frequency; means for impressing selected input signals on said parallel circuit branches resonant thereto; and means for taking outputs from the circuit branches resonant to said intermediate frequencies.

8. A circuit comprising: a narrow junction degenerate semiconductor diode exhibiting a negative resistance region at the low forward voltage range of its current-voltage characteristic; bias means in circuit with said diode establishing a direct current load line which intersects said characteristic only in said negative resistance region; an input resonant circuit branch in series with said diode and resonant to a selected signal frequency; an output resonant circuit branch in series with said diode resonant to a predetermined intermediate frequency; and a local oscillator resonant circuit branch resonant to a frequency such that when mixed with the signal frequency the predetermined intermediate frequency is produced, said local oscillator having a parallel resonant impedance exceeding the highest impedance of either of the other two branches.

No references cited.

Notice of Adverse Decision in Interference

In Interference No. 92,092 involving Patent No. 2,978,576, R. L. Watters, Radio-frequency amplifier and converter circuits, final decision adverse to the patentee was rendered Apr. 22, 1963, as to claims 1, 2, 3, 4, 5 and 8.

[*Official Gazette July 23, 1963.*]